United States Patent [19]
Chai et al.

[11] Patent Number: 5,149,663
[45] Date of Patent: Sep. 22, 1992

[54] METHOD FOR MANUFACTURING A BI-CMOS SEMICONDUCTOR DEVICE

[75] Inventors: Sang H. Chai; Yong S. Koo; Kwang S. Kim; Kee S. Nam, all of Daejeon, Rep. of Korea

[73] Assignee: Korean Electronics and Telecommunications, Rep. of Korea

[21] Appl. No.: 780,253

[22] Filed: Oct. 21, 1991

[30] Foreign Application Priority Data

Oct. 22, 1990 [KR] Rep. of Korea .................. 90-16866

[51] Int. Cl.$^5$ ................ H01L 21/70; H01L 21/265
[52] U.S. Cl. .................................. 437/31; 437/33; 437/59; 437/69; 437/71; 357/43
[58] Field of Search ............ 437/59, 31, 69, 33, 437/71; 148/9, 11; 357/43

[56] References Cited

U.S. PATENT DOCUMENTS 4,816,423  3/1989  Havemann .................. 437/31
5,059,546 10/1991  Havemann .................. 437/59

Primary Examiner—Olik Chaudhuri
Assistant Examiner—Long Pham
Attorney, Agent, or Firm—Evenson, Wands, Edwards, Lenahan & McKeown

[57] ABSTRACT

There is provided a method of manufacturing Bi-CMOS semiconductor devices in which further comprises the steps of; depositing a polysilicon layer, an oxide film and a nitride film one and another in order to form the emitter and collector of a bipolar transistor, and the gates of a CMOS; forming an oxide film and a nitride film at the side wall of the polysilicon layer one and another; etching the exposed portions of an epitaxial layer and depositing other nitride film on the nitride film at the side wall; growing an oxide film on the etched portions of the epitaxial layer and removing all the nitride films; and implanting impurities on portions of the epitaxial layer exposed by the etched nitride films in order to make the inactive base region of the bipolar transistor and the source/drain regions of a PMOS transistor P+ type, and to make the source/drain regions of a NMOS transistor n+ type. Accordingly, the widths of the regions can be decreased and thus junction capacitance can be reduced in accordance with the magnitude of the decreased width.

1 Claim, 3 Drawing Sheets

METHOD FOR MANUFACTURING A BI-CMOS SEMICONDUCTOR DEVICE

BACKGROUND OF THE INVENTION

1. Field of the Invention

The present invention relates to a method for manufacturing a Bi-CMOS semiconductor device and, more particularly to a fabricating method for producing a high speed and high packing density semiconductor device (Bi-CMOS) through the combination of bipolar device to be used in high speed circuits and complementary metal oxide semiconductor (CMOS) device to be used in high packing density circuits.

2. Description of the Prior Art

Generally, to fabricate computer system, communication system or the like to be used for processing information, various integrated-circuits comprising a plurality of semiconductor devices are required. In addition, in the case that information to be performed in such system are composed of a large scale of capacitance, it is well known that a plurality of high speed and high packing density semiconductor devices possible to rapidly process a large scale of information are necessary to fabricate such integrated-circuits.

Semiconductor devices used in large numbers to fabricate such circuits are classified into two types of devices, that is, bipolar device and MOS (metal oxide semiconductor) device. The former is used in high speed circuits due to high speed operating characteristic, but can not be manufactured in high packing density as compared to a MOS device. The latter is used in high packing density circuits due to its small size, but can not be operated in high speed due to large junction capacitance.

Accordingly, to manufacture a high speed and high packing density semiconductor device, there is provided Bi-MOS semiconductor device in which a high speed bipolar transistor and a high packing density MOS device are formed on the same substrate. In recent years, the trend in the design of integrated devices is that various types of Bi CMOS's having CMOS device instead of MOS device have been developed in order to reduce power consumption of the semiconductor device.

Such Bi-CMOS semiconductor device can be applied to integrated circuits necessary for high speed, high packing density and low consumption of power source.

Prior Bi-CMOS semiconductor device with a standard buried collector (hereinafter, referred to as "SBC") bipolar transistor is shown in FIG. 1. Since the SBC bipolar transistor is manufactured by means of a device isolation method based on P-N junction, decreasing the width of a bipolar transistor is largely restricted by a lateral diffusion and the occurrence of a depletion area therein, and problem occurs in operating speed of a device due to the increment of resistance or capacitance.

In order to solve the said problem which may be occurred in the prior Bi CMOS, another prior Bi-CMOS semiconductor device with a polysilicon self-aligned (hereinafter, referred to as "PSA") bipolar transistor has been already fabricated. The technology of manufacturing the prior Bi-CMOS semiconductor device with PSA bipolar transistor is disclosed in U.S. Pat. Nos. 4,868,135, 4,737,472, and U.S. Pat. No. 4,954,458.

In details, the respective patents show a process for manufacturing Bi-CMOS semiconductor devices wherein the bipolar transistor is formed by means of a device isolation method based on an oxide film ($SiO_2$) instead of P-N junction, and the emitter and base of such bipolar device are self-aligned by means of polysilicon film, and thus the size and capacitance of the PSA bipolar transistor can be largely decreased as compared to SBC bipolar transistor and integration can be more improved.

However, in the Bi-CMOS semiconductor device with PSA bipolar transistor manufactured by the prior technology as shown FIG. 2, since the width of inactive base region 1 with in the PSA bipolar transistor and the widths of the base and collector thereof are large, and junction capacitance between base and collector thereof is increases, problem occurs in operating speed of the Bi-CMOS semiconductor device.

SUMMARY OF THE INVENTION

It is the object of the present invention to provide a method of manufacturing a Bi-CMOS semiconductor device in which the width of the inactive base region of a bipolar transistor, and the widths of the source/drain regions of a CMOS device can be extremely decreased and thus junction capacitance to be produced in the respective regions can be largely reduced.

According to the aspect of the present invention, there is provided a method for manufacturing a Bi-CMOS semiconductor device which comprises the steps of: (a) forming an N+ type buried layer upon a P type silicon substrate; (b) growing an N type epitaxial layer upon it; (c) depositing an oxide film and carrying out a masking process for defining a P well; (d) implanting and diffusing an impurity down to the N type epitaxial layer in order to form a P well; (e) removing the oxide film only on the P well and N type epitaxial layer; (f) growing an oxide, and depositing a nitride film on the oxide film upon the P well and N type epitaxial layer; (g) defining device active regions by means of an active region mask: (h) ion-implanting an impurity by means of a field mask in order to form P+ junction isolation regions; (i) growing an oxide film to form device isolation regions by means of an oxide isolation process; (j) growing a gate oxide film of CMOS transistor after removal of the oxide film and nitride film; (k) ionimplanting an impurity in order to form the base and collector of a bipolar transistors after removing the gate oxide film of the regions corresponding to the base and collector of the bipolar transistor; (l) forming N+ type polysilicon on the N type epitaxial layer corresponding to region in which the emitter of the bipolar transistor is formed and on the gate oxide film corresponding to regions in which gates of the CMOS transistor are formed, and sequentially depositing an oxide film and a first nitride film for defining the emitter and collector of the bipolar transistor and the gates of the CMOS transistor; (m) sequentially depositing an oxide film and a second nitride film at side walls of the N+ type polysilicon; (n) etching exposed portions of the N+epitaxial layer up to determined depth and depositing a third nitride film at side walls of the second nitride film; (o) depositing an oxide film on the etched portions of the epitaxial layer; and (p) implanting impurities to portions of the epitaxial layer exposed by removal of the second and third nitride film in order to make base regions of the bipolar transistor and source/drain regions of a PMOS transistor P+type and to make source/drain regions of an NMOS transistor N+type.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT

Figure 3A:
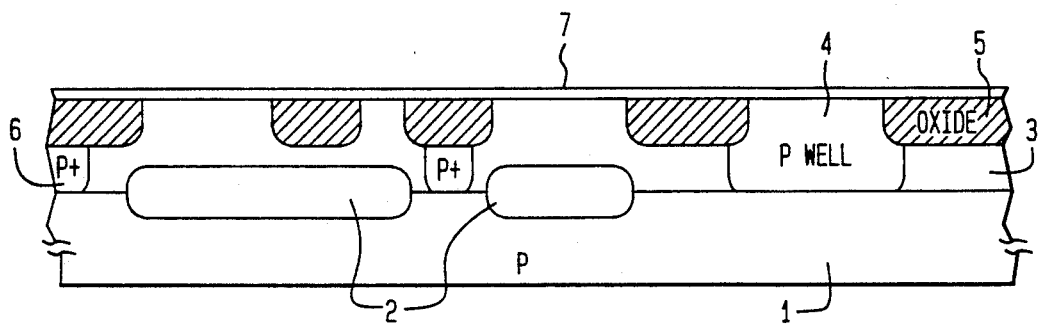
FIG. 3A to 3F show cross-sectional views in the manufacturing sequence illustrating the method for manufacturing a Bi-CMOS semiconductor device in accordance with the present invention.

FIG. 3A shows the process sequence from forming step of a buried layer to growing step of a gate oxide film. First, a buried layer mask is used upon the surface of a P type silicon substrate 1 in order to establish the regions for forming a bipolar transistor and a PMOS device. Then, by ion implanatation with arsenic, n+ buried layer 2 is formed upon the substrate 1, and an epitaxial layer 1.5 to 2 μm thick doped with phosphorus is formed.

After the step of oxide deposition and the masking process for defining a P well, boron ion is implanted, diffusion is carried out at a temperature of 1180° C. for two hours, then the boron ion is diffused down to an epitaxial layer 3 and thus a p well 4 is formed up for NMOS device.

An oxide film 5000 Å thick is deposited after the removal of the remaining oxide film on it, and then a nitride film ($Si_3N_4$) 1200 Å thick is formed by a low pressure chemical vapor deposition method (LPCVD). Then active regions for respective devices are defined by means of an active region mask, and forming isolation regions of devices 5 by means of an oxide isolation method. Before the growth of the oxide film, under the isolating oxide film for the isolation of the bipolar transistors, P type junction isolation areas 6 are defined by means of a field mask and then, an impurity (such as boron) ion is implanted and diffused.

After removing the nitride film, the N area except the P well 4 of the NMOS device is thinly ion-implanted with boron in order to control the threshold voltage of the PMOS devices, and the oxide film is removed, as well as a gate oxide film 7 of CMOS devices is grown.

Figure 3B:
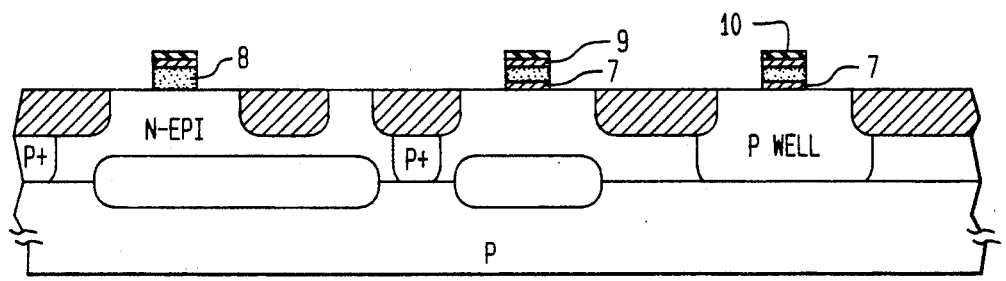

FIG. 3B shows the process of forming the emitter and collector of the bipolar transistor by means of polysilicon, and gates of the CMOS device. First, the base and the collector portions of the bipolar transistor are respectively defined by means of a mask. Then boron and phosphorous are respectively ion-implanted and diffused in order to complete the base and the collector. Then polysilicon film is deposited up to the thickness of 3000 Å by means of low pressure chemical vapor deposition method, and then is ion-implanted with arsenic to form an N+ type polysilicon layer 8, as well as an oxide film 9 and a nitride film 10 are respectively deposited at the thicknesses of 2500 Å and 2000 Å in order to serve as a mask layer. Then gates of the NMOS and PMOS devices, and the emitter and collector of the bipolar transistors are formed by means of the reactive ion etching method, and N+ polysilicon to P+ polysilicon separation is formed by means of an anisotropic etching of oxide film and polysilicon.

Figure 3C:
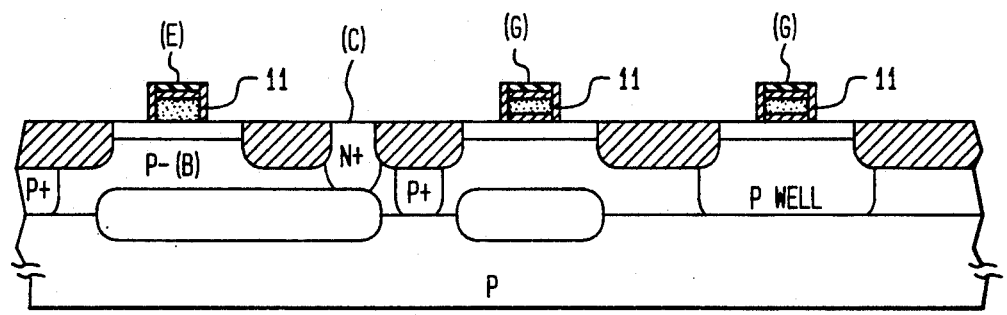

FIG. 3C shows the process of electrically insulating a side wall of the n+ type polysilicon layer 8 which serves as the emitter and collector of the bipolar transistor, and the gates of the CMOS device. First, after depositing an oxide film 3000 Å thick by means of low pressure chemical vapor deposition method, the anisotropic etching process of a dry etching method is carried out in order to etch away all the oxide film from all the horizontal sides of the n+ type polysilicon 8 including its upper side, except the vertical side wall 11.

Figure 3D:
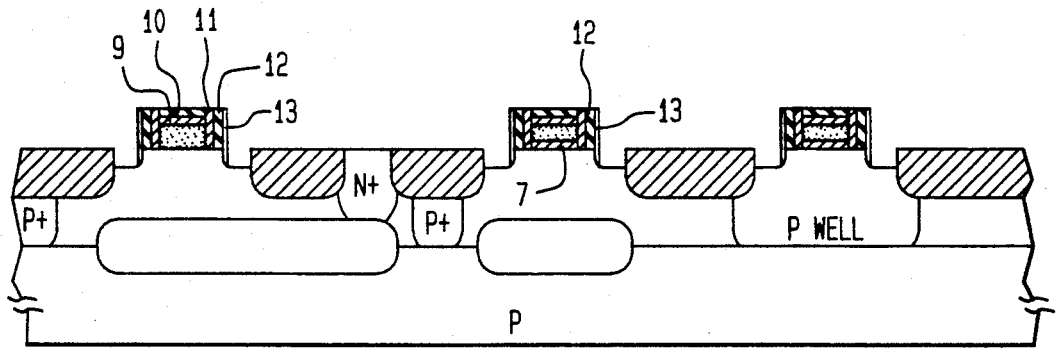

FIG. 3D shows the process of etching away externally exposed portions of the epitaxial layer 3. After depositing a nitride film 3000 Å thick by means of the low pressure chemical vapor deposition method, the anisotropic etching process of the dry etching method is carried out in order to etch away all the nitride except a vertical side wall of the N+ type polysilicon layer 8. Moreover, the externally exposed portions of the epitaxial layer 3 are etched away up to the thickness of 1500 Å by means of the dry etching method, and then a nitride film 700 Å thick is deposited upon it and etched away all the nitride except a vertical side wall of the nitride film 12 by means of the anisotropic etching process, so that only at the vertical side wall of the nitride film 12 the nitride film 13 is formed.

Figure 3E:
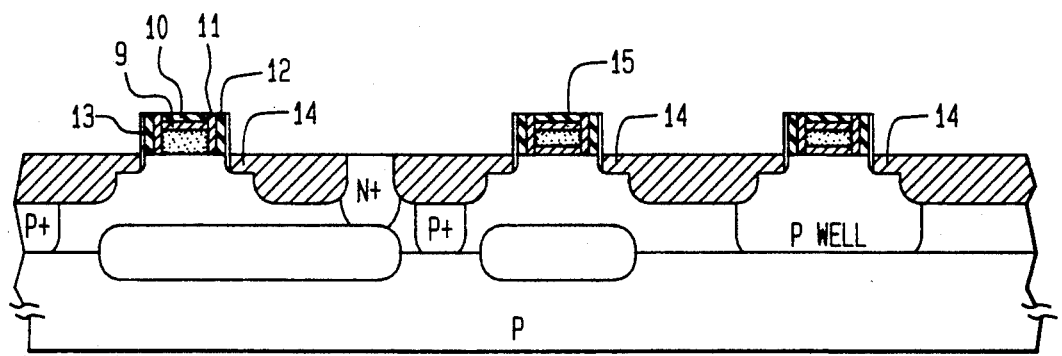

FIG. 3E shows the process of depositing an oxide film in order to decrease the width of an inactive base region in the bipolar transistor, and the widths of a source/drain region in the CMOS device. First, an oxide film 14 is deposited only on the exposed portions of the epitaxial layer 3 by means of a annealing oxide growing method. Then, the remaining nitride film 10, 12, and 13 serve as preventing function that the oxide film 14 is not grown into the n+ type polysilicon 15 for forming the emitter and collector of the bipolar transistor and the gate of the CMOS device.

Figure 3F:
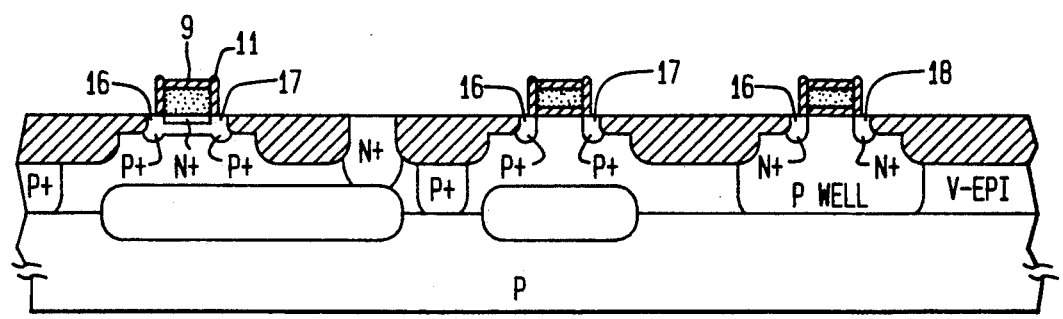

FIG. 3F shows the process of removing all the nitride films in order to extremely decrease the widths as mentioned above. First, when all the nitride films 10, 12, and 13 are removed away by means of phosphoric acid, portions 16 of the epitaxial layer 3 are exposed at the side walls of the n+ type polysilicon 8. Then the respective portions 16 of the epitaxial layer 3 exposed by removal of the second and third nitride film 12 and 13 have the same width as one of the laminated nitride films 12 and 13. In this embodiment, the laminated nitride films 12 and 13 are formed up to the width of 3000 Å.

Next, with a photolithographic etching method, boron-ions of an impurity are implanted to the exposed portions 16 in which the base of the bipolar transistor and the source/drain of a PMOS device are formed, in order to make the portions p+ type. Also, arsenic ions of an impurity are implanted the other exposed regions in which the source/drain of a NMOS are formed, in order to make the other exposed portions n+ type. Therefore, with annealing process, there is provided the inactive base regions of the bipolar transistor and the source/drain of the CMOS device with the extremely thin width.

Figure 1:
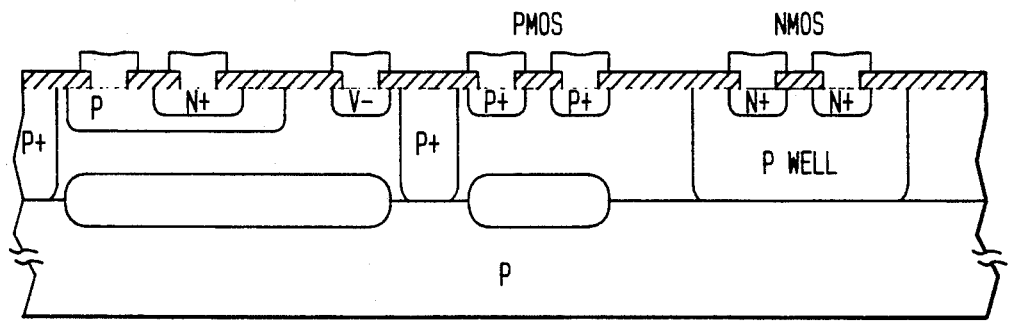
FIG. 1 shows a cross-sectional view of a prior art Bi-CMOS semiconductor device with SBC (Standard Buried Collector) bipolar transistor.
Figure 2:
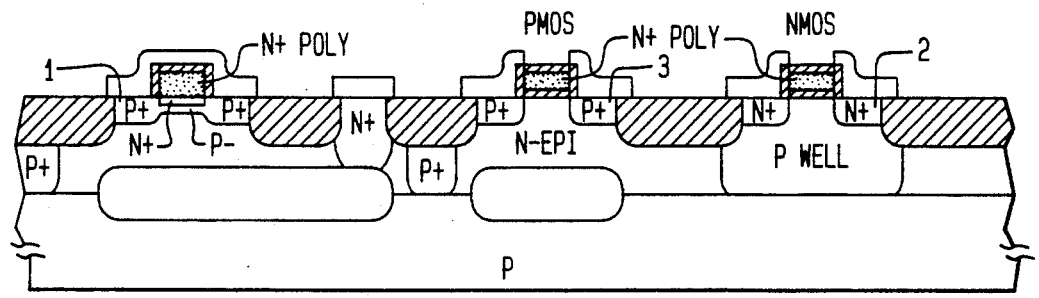
FIG. 2 shows a cross-sectional view of an other prior art Bi-CMOS semiconductor device with PSA (Polysilicon Self-Aligned) bipolar transistor.
Figure 4:
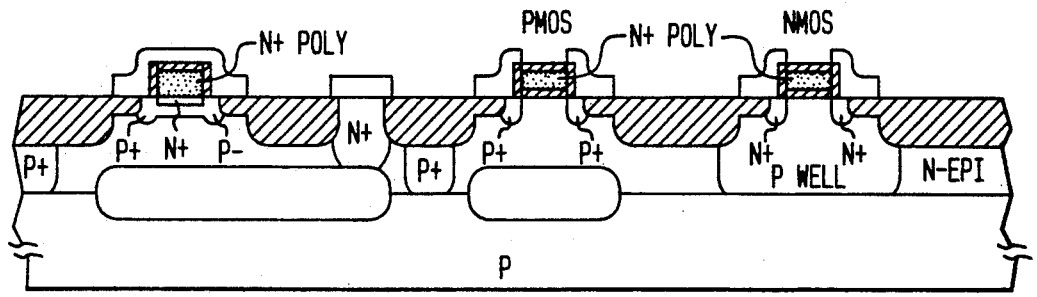
FIG. 4 shows a cross-sectional view of the Bi-CMOS semiconductor device formed according to the manufacturing method of the present invention.

IN addition, when general later processes such as process of an oxide film deposition, process of a contact masking, and process of an aluminum coating, are carried out. The processes of manufacturing Bi-CMOS device on the same substrate are completed, as shown in FIG. 4.

As described above, according to the present invention, due to the fact that inactive base region of bipolar transistor and source/drain regions of CMOS device in a Bi-COMS are formed in proportion to the width of two nitride film at the side wall n+ type polysilicon, the widths of the base region and the source/drain region can be extremely reduced. Accordingly, since the Bi-COMS according to the invention can be relatively reduced in the widths of the base region the source/drain regions of a CMOS, as compared to the prior art Bi-CMOS, junction capacitance between the base and the collector of a bipolar transistor can be reduced, junction capacitance to be produced in the source/drain of a CMOS device can be also reduced, and thus operating speed of a Bi-CMOS can be improved.

It is understood that various other modification will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be created as equivalents thereof by those skilled in the art to which this invention pertains.

What is claimed is:

1. A method for manufacturing a Bi-CMOS device comprising the steps of:

(a) forming an N+ type huried layer upon a P type silicon substrate;
   (b) growing an N type epitaxial layer upon it;
   (c) depositing an oxide film and carrying out a masking process for defining a P well;
   (d) implanting and diffusing an impurity down to the N type epitaxial layer in order to form a P well;
   (e) removing the oxide film only on the P well and N type epitaxial layer;
   (f) growing an oxide, and depositing a nitride film on the oxide film upon the P well and N type epitaxial layer;
   (g) defining device active regions by means of an active region mask;
   (h) ion-implanting an impurity by means of a field mask in order to form P+ junction isolation regions;
   (i) growing an oxide film to form device isolation regions by means of an oxide isolation process;
   (j) growing a gate oxide film of CMOS transistor after removal of the oxide film and nitride film;
   (k) ion-implanting an impurity in order to form base and collector of bipolar transistor after removing the gate oxide film of the regions corresponding to the base and collector of the bipolar transistor;
   (l) forming N+ type polysilicon on the N type epitaxial layer corresponding to region in which the emitter of the bipolar transistor is formed and on the gate oxide film corresponding to regions in which gates of the CMOS transistor are formed, and sequentially depositing an oxide film and a first nitride film for defining the emitter and collector of the bipolar transistor and the gates of the CMOS transistor;
   (m) sequentially depositing an oxide film and a second nitride film at side walls of the N+ type polysilicon;
   (n) etching exposed portions of the N+epitaxial layer up to determined depth and depositing a third nitride film at side portions of the second nitride film;
   (o) depositing an oxide film on the etched portions of the epitaxial layer; and
   (p) implanting impurities to portions of the epitaxial layer exposed by removal of the second and third nitride film in order to make base region of the bipolar transistor and source/drain regions of a PMOS transistor P+type, and to make source/drain regions of an NMOS transistor N+type.

* * * * *